(12) United States Patent
Yamagata et al.

(10) Patent No.: US 8,860,590 B2
(45) Date of Patent: Oct. 14, 2014

(54) AUTOMATIC GAIN CONTROL SYSTEM FOR AN ANALOG TO DIGITAL CONVERTER

(71) Applicant: Imagination Technologies, Ltd., Kings Langley (GB)

(72) Inventors: Taku Yamagata, Chepstow (GB); Adrian John Anderson, Chepstow (GB)

(73) Assignee: Imagination Technologies, Limited, Kings Langley, Hartfordshire (GB)

( * ) Notice: Subject to any disclaimer, the term of this patent is extended or adjusted under 35 U.S.C. 154(b) by 0 days.

(21) Appl. No.: 14/153,251

(22) Filed: Jan. 13, 2014

(65) Prior Publication Data

US 2014/0218222 A1 Aug. 7, 2014

(30) Foreign Application Priority Data

Jan. 15, 2013 (GB) .................................. 1300711.7

(51) Int. Cl.
  *H03M 1/06* (2006.01)
  *H03M 1/08* (2006.01)
  *H03M 1/18* (2006.01)
  *H03M 1/12* (2006.01)
  *H03G 3/30* (2006.01)

(52) U.S. Cl.
  CPC ................ *H03M 1/08* (2013.01); *H03M 1/185* (2013.01); *H03M 1/12* (2013.01); *H03G 3/3052* (2013.01)
  USPC ........... 341/118; 375/329; 375/355; 375/345; 375/365; 375/316; 348/537; 348/536; 327/141; 327/161; 330/279; 330/278; 330/129; 341/155

(58) Field of Classification Search
  CPC . H03H 17/027; H03H 17/0294; H03G 3/001; H03G 3/3052; H03G 3/3084; H03L 7/081; H03L 7/091; H03L 7/087; H03L 7/087; H03L 7/00; H04N 5/232; H04N 5/2354; H04N 5/335; H04N 5/372; H04N 5/20; H03M 3/488
  USPC .......... 341/118–155; 375/329, 355, 345, 365, 375/316, 148; 348/537, 222.1, 536; 327/141, 161; 330/279, 129, 278
  See application file for complete search history.

(56) References Cited

U.S. PATENT DOCUMENTS

| | | | |
|---|---|---|---|
| 5,917,372 A | 6/1999 | Kakura | |
| 6,191,725 B1 * | 2/2001 | Lavoie | 342/92 |
| 6,417,730 B1 * | 7/2002 | Segallis et al. | 330/129 |
| 6,680,680 B1 * | 1/2004 | Mellot | 341/143 |
| 6,748,038 B1 * | 6/2004 | McCall | 375/345 |

(Continued)

OTHER PUBLICATIONS

Combined Search and Examination Report under Sections 17 and 18(3) (5pgs), dated Apr. 29, 2013, as cited in GB Application 1300711.7.

*Primary Examiner* — Lam T Mai
(74) *Attorney, Agent, or Firm* — Michael S. Garrabrants

(57) ABSTRACT

Methods and circuits for controlling an automatic gain control (AGC) circuit wherein the AGC circuit is used to adjust the gain of a signal input to an analog to digital converter. The method includes obtaining a plurality of samples from the output of the analog to digital converter and determining whether the amplitude of each sample is greater than a threshold amplitude value. If the amplitude of a sample is greater than the threshold amplitude value then a counter value is incremented. The target average amplitude of the automatic gain control circuit is then periodically adjusted based on the counter value.

14 Claims, 5 Drawing Sheets

(56) References Cited

U.S. PATENT DOCUMENTS

| | | | |
|---|---|---|---|
| 6,930,553 B2 * | 8/2005 | Takahashi | 330/279 |
| 6,996,193 B2 * | 2/2006 | Yamagata et al. | 375/329 |
| 7,161,997 B2 * | 1/2007 | Spiegel et al. | 375/350 |
| 7,295,073 B2 * | 11/2007 | Hsieh et al. | 330/279 |
| 7,796,176 B2 * | 9/2010 | Mimata et al. | 348/312 |
| 7,990,426 B2 * | 8/2011 | Tanaka et al. | 348/221.1 |
| 8,466,713 B2 * | 6/2013 | Stojanovic et al. | 327/2 |
| 8,731,899 B2 * | 5/2014 | Mahr et al. | 703/27 |
| 2007/0164823 A1 | 7/2007 | Hsieh et al. | |
| 2008/0018508 A1 | 1/2008 | Filipovic et al. | |
| 2008/0100485 A1 | 5/2008 | Tanaka et al. | |
| 2008/0101215 A1 | 5/2008 | Tanaka et al. | |

* cited by examiner

AUTOMATIC GAIN CONTROL SYSTEM FOR AN ANALOG TO DIGITAL CONVERTER

BACKGROUND

An analog to digital converter (ADC) receives an analog input signal and converts it into a digital signal. The conversion involves quantization of the analog input signal which maps the almost infinitely variable amplitude of the analog signal to one of a finite series of discrete levels. This many to one mapping invariably introduces error into the digital signal. The difference between the input analog signal and the output digital signal is referred to as the quantization error or noise.

To minimise the quantization noise, automatic gain control (AGC) is often used to adjust the amplitude of the analog signal before it is input to the ADC.

Typically an AGC circuit is configured to calculate the average amplitude of the output of the ADC over a predetermined number of samples (e.g. 10 or 100 samples) and compare this to a target average amplitude. The AGC circuit then adjusts the gain applied to the input signal so that the average amplitude of the ADC output will be equal to the target average amplitude.

However, it is difficult to select a single target average amplitude that will work for a variety of input signals.

The embodiments described below are not limited to implementations which solve any or all of the disadvantages of known systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are methods and circuits for controlling an automatic gain circuit used to adjust the gain of an analog to digital converter input signal. The method includes obtaining a plurality of samples from the output of the analog to digital converter. Then for each sample, it is determined whether the amplitude of the sample is greater than a threshold amplitude value wherein the threshold amplitude value is less than the saturation point of the analog to digital converter. If the amplitude of the sample is greater than the threshold amplitude value, a counter value is incremented. The target average amplitude of the automatic gain control circuit is then periodically adjusted based on the counter value.

A first aspect provides a method of controlling an automatic gain control circuit used to adjust the gain of a signal input to an analog to digital converter, the method comprising (a) sampling the output of the analog to digital converter; (b) determining whether the amplitude of the sample is greater than a threshold amplitude value, the threshold amplitude value being less than the saturation point of the analog to digital converter; (c) if the amplitude of the sample is greater than the threshold amplitude value, incrementing a counter value; (d) repeating steps (a) to (c); and (e) periodically adjusting a target average amplitude of the automatic gain control circuit based on the counter value.

A second aspect provides a circuit to dynamically control an automatic gain circuit used to adjust the gain of a signal input to an analog to digital converter, the circuit comprising: a comparator circuit configured to: obtain a plurality of samples of the output of the analog to digital converter; and determine, for each sample, whether the amplitude of the sample is greater than a threshold amplitude value, the threshold amplitude value being less than the saturation point of the analog to digital converter; and if a sample is greater than the threshold amplitude value, output an indication that the sample is greater that the threshold amplitude value; a counter circuit coupled to the comparator circuit, the counter circuit configured to receive the indications from the comparator circuit and increment a counter value for each indication received; and a target control circuit coupled to the counter circuit, the target control circuit configured to periodically receive the counter value from the counter circuit and adjust a target average amplitude of the automatic gain control circuit based on the counter value.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
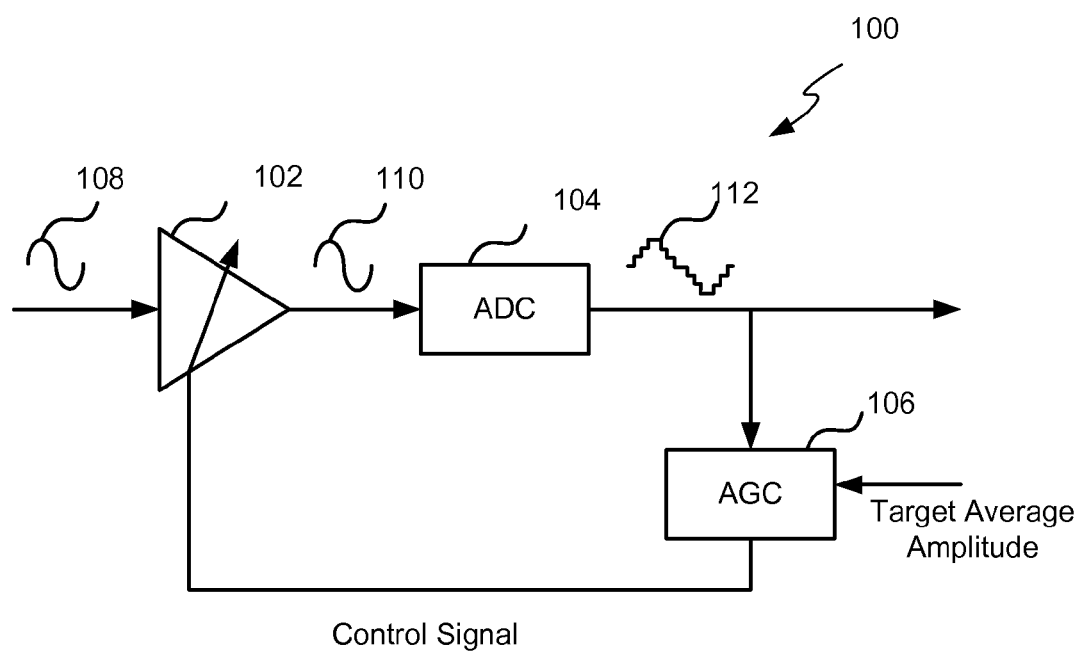
FIG. 1 is a schematic diagram of a known automatic gain control loop for an analog to digital converter.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

As is known to those of skill in the art an analog to digital converter (ADC) receives an analog input signal and converts it into a digital signal. The conversion involves quantization of the analog input signal which maps the almost infinitely variable amplitude of the analog signal to one of a finite series of discrete levels. This many to one mapping invariably introduces error into the digital signal. The difference between the input analog signal and the output digital signal is referred to as the quantization error or noise.

The quality of an ADC is often measured in terms of its signal-to-noise ratio (SNR). The SNR is the relationship of the amplitude of the input signal to the amplitude of the quantization noise at a given time. The SNR is typically measured in terms of decibels (dB) and is given by equation (1):

$$SNR_{dB} = 20 \log_{10} \frac{\text{Signal Amplitude}}{\text{Noise Amplitude}} \quad (1)$$

To minimise the quantization noise and thus improve the SNR, automatic gain control (AGC) is often used to adjust the amplitude of the analog signal before it is input to the ADC.

Reference is now made to FIG. 1 which illustrates a schematic diagram of a known AGC loop 100 for adjusting the amplitude of an analog signal input to an ADC. The AGC loop 100 comprises a gain amplifier 102, an ADC 104 and an AGC circuit 106.

The gain amplifier 102 receives an analog input signal 108 and applies a gain to the analog input signal 108 to produce a gain-adjusted analog signal 110. If the gain is one, the analog input signal 108 remains unchanged; if the gain is higher than one, the analog input signal 108 is amplified. If the gain is lower than one, the analog input signal 108 is reduced.

The gain-adjusted analog signal 110 is provided to the ADC 104. The ADC 104 then converts the gain-adjusted analog signal 110 into a digital signal 112 using quantization.

The AGC circuit 106 measures the amplitude of the digital signal 112 and adjusts the gain applied by the gain amplifier 102 accordingly. In some cases the AGC circuit 106 adjusts the gain applied by the gain amplifier 102 by generating a control signal which controls the gain applied by the gain amplifier 102.

Typically the AGC circuit 106 is configured to calculate the average amplitude of the digital signal 112 over a predetermined number of samples (e.g. 10 or 100 samples) and compare this to a target average amplitude. The AGC circuit 106 then adjusts the gain applied by the gain amplifier 102 in an attempt to make the average amplitude of the digital signal 112 equal to the target average amplitude. For example, if the average amplitude of the digital signal 112 is above the target average amplitude the AGC circuit 106 may reduce the gain applied by the gain amplifier 102. Conversely, if the average amplitude of the digital signal 112 is below the target average amplitude the AGC circuit 106 may increase the gain applied by the gain amplifier 102.

In known AGC loops, such as that shown in FIG. 1, the target amplitude value is predetermined and fixed.

To minimize the quantization noise, the target average amplitude is ideally selected to maximize the amplitude of the input to the ADC 104 (i.e. the gain-adjusted analog signal 110) while avoiding saturation of the ADC 104. Each ADC has a voltage range in which it operates (e.g. +/−10,000 mV). If the ADC receives a signal outside of this range (e.g. +/−15,000 mV), the ADC would interpret this as the min/max in the range (e.g. +/−10,000 mV) which would be in error. This error is called saturation of the ADC. Accordingly, ideally the signal input to the ADC (e.g. gain-adjusted analog signal 110) spans as much of the voltage range as possible, without saturating the ADC 104, since this increases the SNR.

Figure 2:
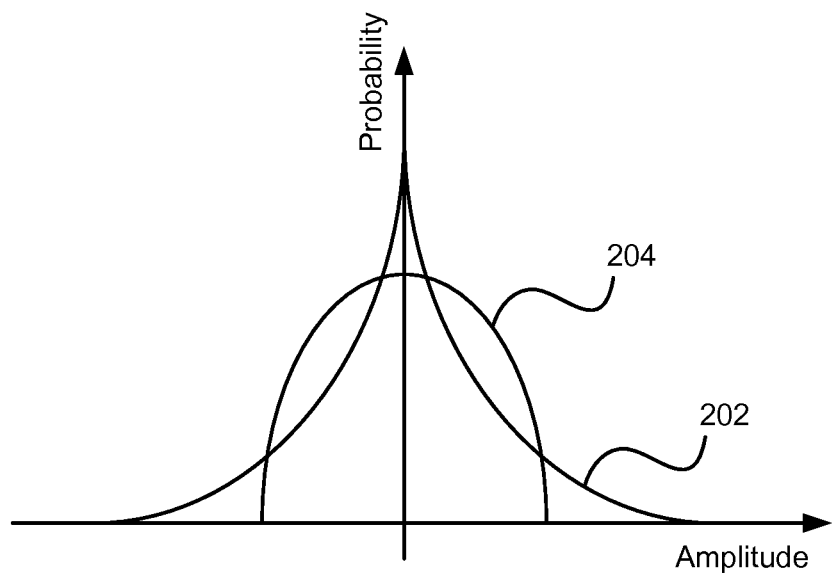
FIG. 2 is a graph of the amplitude distribution of a wide amplitude distribution signal and a narrow amplitude distribution signal.

Accordingly, the ideal target average amplitude depends on the amplitude distribution of the input analog signal. For example, a small target average amplitude may be used with a signal with a wide amplitude distribution to avoid saturation of the ADC 104. Conversely, a higher target average amplitude may be used with a signal with a well contained or narrow amplitude distribution. Reference is now made to FIG. 2 which illustrates the amplitude distribution of a wide amplitude distribution signal 202 and a well contained or narrow amplitude distribution signal 204. As can be seen in FIG. 2, the amplitude of the first signal 202 is more widely varied (e.g. covers a larger range) than the second signal 204.

Since the amplitude distribution of an analog signal can vary over time it is difficult to select a single target average amplitude that will work well for all conditions. Accordingly, using a single-fixed target average amplitude makes it difficult to fully utilize the dynamic range of the ADC 104 for an input analog signal that has a varying amplitude distribution.

Embodiments described herein relate to circuits and methods for automatically adjusting the AGC target average amplitude based on the input signal. Specifically, in the circuits and methods described herein the output of the ADC (e.g. digital signal 112) is monitored to determine the number or percentage of samples above a threshold amplitude value. The AGC target average amplitude is then adjusted based on the number/percentage of samples above and/or below the threshold amplitude value so that there are only a small number of samples above the threshold amplitude value. For example, in some cases if there are more than a threshold number of samples above the threshold amplitude value the target average amplitude may be decreased, and if there are less than the threshold number of samples above the threshold amplitude value the target average amplitude may be increased.

The methods and circuits described herein allow the AGC target average amplitude to adapt to changes in input signal (e.g. changes in the amplitude distribution) so the AGC circuit 106 maximizes the dynamic voltage range of the ADC 104 and reduces quantization noise. Selecting an appropriate AGC target average amplitude minimizes signal saturation at the ADC 104 yet maximizes the amplitude of the signal.

Figure 3:
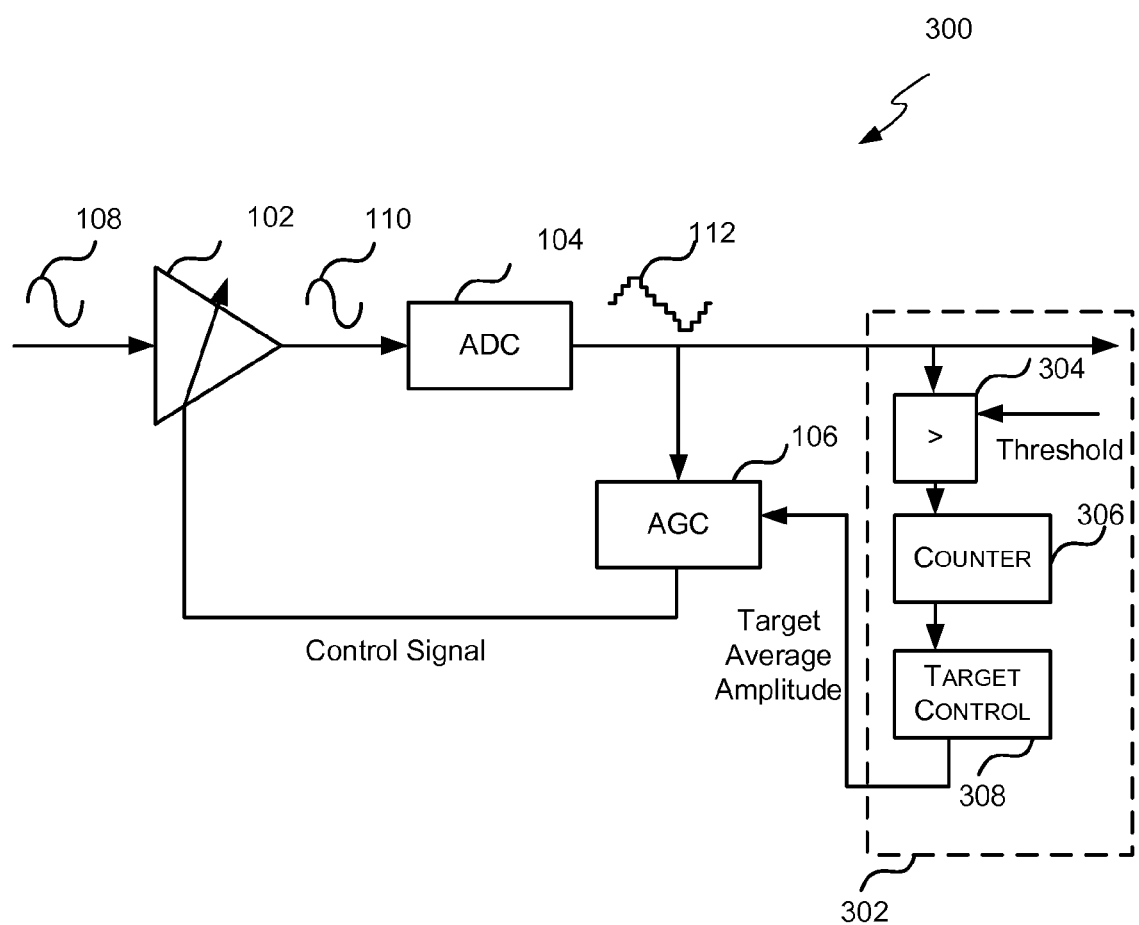
FIG. 3 is a schematic diagram of an example automatic gain control loop for an analog to digital converter where the target average amplitude is dynamically selected.

Reference is now made to FIG. 3 which illustrates an AGC loop 300 where the AGC target average amplitude is automatically and dynamically adjusted based on the input signal. The AGC loop 300 comprises the gain amplifier 102; ADC 104; and AGC circuit 106 of FIG. 1. However, instead of the AGC target average amplitude being fixed, it is adaptively selected by an AGC target selection circuit 302. Specifically, the AGC target selection circuit 302 monitors the digital signal 112 to determine how often it exceeds a threshold amplitude value and adjusts the AGC target average amplitude accordingly.

The AGC target selection circuit 302 of FIG. 3 comprises a comparison circuit 304, a counter circuit 306, and a target control circuit 308. The comparison circuit 304 samples the digital signal 112 and compares the sample to a threshold amplitude value. If the amplitude of the sample exceeds the threshold amplitude value the comparison circuit 304 provides an indication to the counter circuit 306 that the sample exceeds the threshold amplitude value.

In some cases the comparison circuit 304 may be configured to only provide an output if the sample exceeds the threshold amplitude value. In these cases the fact there is an output indicates that the amplitude of the sample exceeds the threshold amplitude. In other cases, the comparison circuit 304 may be configured to provide an output after each sample, the content of the output indicating whether the amplitude of the sample exceeds the threshold amplitude value or not. For example, the comparison circuit 304 may be configured to provide a binary output (e.g. 1/0, YES/NO, TRUE/FALSE) after each sample indicating whether the sample exceeds the threshold amplitude value. For example, the comparison circuit may output a YES if the amplitude of the sample exceeds the threshold amplitude value and a NO if the amplitude of the sample does not exceed the threshold amplitude value.

The threshold amplitude value is selected to be below, but close to, the saturation point of the ADC 104. In some cases the threshold amplitude value is fixed. In other cases the threshold amplitude value may be adjustable.

The threshold amplitude value may alternatively be represented by a threshold backoff level. The threshold backoff level represents, in dB, how far below the saturation point the threshold amplitude value is. The threshold amplitude value may be calculated from the threshold backoff level and the saturation point using formula (2) shown below:

$$\text{Threshold Amplitude Value} = \frac{\text{Saturation Point}}{10^{\frac{threshold\ backoff\ level_{dB}}{20}}} \quad (2)$$

Each time the counter circuit 306 receives an indication from the comparison circuit 304 that a sample has exceeded the threshold amplitude value, the counter circuit 306 increments a counter value. After a predetermined number of samples have been taken, or a predetermined time has elapsed the counter circuit 306 provides the counter value to the target control circuit 308 and then resets the counter value.

As described above, in some cases the comparison circuit 304 may be configured to provide an output after each sample indicating whether the amplitude of the sample exceeds the threshold amplitude value. In these cases, the comparison circuit 304 may comprise two counter values. The first counter value keeps track of the number of samples that have exceeded the threshold amplitude value. For example, the first counter value may be incremented each time the counter circuit 306 receives an indication that the sample has exceeded the threshold amplitude value. The second counter value (the sample counter value) keeps track of the number of samples taken. For example, the sample counter value may be incremented each time the counter circuit 306 receives an output from the comparison circuit 304. Once the sample counter value has reached a predetermined number of samples, the counter circuit 306 may be configured to provide the counter value to the target control circuit 308 and reset both the counter value and the sample counter value.

In other cases, the counter circuit 306 may be configured with a timer circuit and once the timer indicates that a predetermined period of time has elapsed, the counter circuit 306 may be configured to provide the counter value to the target control circuit 308 and reset the counter value and the timer circuit.

In still other cases, the target control circuit 308 may be configured to keep track of the number of samples taken or the period of time that has elapsed. For example, in cases where the comparison circuit 304 is configured to provide an output after each sample indicating whether the amplitude of the sample exceeds the threshold amplitude value, the target control circuit 308 may be configured to receive the output of the comparison circuit 304 and use this to keep track of the number of samples taken. Alternatively, the target control circuit 308 may be configured with a timer circuit to determine the amount of time that has elapsed. In these cases, once the target control circuit 308 has determined that a predetermined number of samples have been taken or that a predetermined period of time has elapsed, the target control circuit 308 may be configured to request the counter value from the counter circuit 306. Upon receiving the request from the target control circuit 308 the counter circuit 306 may be configured to provide the counter value to the target control circuit 308 and reset the counter value.

The predetermined number of samples may be selected so that the threshold counter value used by the target control circuit 308 is greater than one. Since the predetermined number of samples determines how often the target average amplitude is adjusted or updated and thus the convergence speed, performance may be improved by selecting the smallest acceptable predetermined number of samples.

Once the target control circuit 308 has received the counter value from the counter circuit 306, the target control circuit 308 adaptively adjusts the AGC target average amplitude based on the counter value.

In some cases, adaptively adjusting the AGC target average amplitude comprises comparing the counter value against first and second threshold counter values. If the counter value is greater than the first threshold counter value then the target control circuit 308 may decrease the target average amplitude value. Conversely, if the counter value is less that the second threshold counter value then the target control circuit 308 may increase the target average amplitude. If the counter value is between or equal to the threshold counter values then the target control circuit 308 may not make any changes (increases/decreases) to the target average amplitude.

In some cases, the first and second threshold values are the same. Accordingly, in these cases if the counter value is greater than the threshold counter value then the target control circuit 308 may decrease the target average amplitude value. Conversely, if the counter value is less than the threshold counter value then the target control circuit 308 may increase the target average amplitude value. If the counter value is equal to the threshold counter value then the target control circuit 308 may not make any changes (increases/decreases) to the target average amplitude.

The threshold counter value that triggers a decrease in the target average amplitude value (e.g. the first threshold counter value) may be selected based on the threshold amplitude value used by the comparison circuit 304. For example, in some cases the closer the threshold amplitude value is to the ADC saturation point the lower the threshold counter value. Conversely, the further the threshold amplitude value is from the ADC saturation point the higher the threshold counter value.

A lower threshold amplitude value (and thus a higher threshold counter value) may converge more quickly. Conversely, a higher threshold amplitude value (and thus a lower threshold counter value) may take more time to converge, but may produce a more accurate estimate of the number of samples likely to saturate the ADC. It should be noted, however, that selecting too low a value for the threshold counter value may cause asymmetric behaviour in the target average amplitude. Specifically, selecting too low a value for the threshold counter may cause the target average amplitude to increase faster than it decreases causing it to converge to a different value than expected and making the loop noisier.

In some cases, the threshold counter value can be expressed as a percentage of the number of samples taken. The threshold counter value may then be calculated from the percentage value from equation (3) shown below:

$$\text{threshold counter value} = X * \frac{\text{precentage}}{100} \quad (3)$$

where X is the predetermined number of samples taken.

The threshold amplitude value (and the corresponding threshold counter value) may be selected based on the application in which the ADC will be used. For example, some applications may require fast convergence where others may require a more accurate estimate of the number of samples likely to saturate the ADC.

In an exemplary case, where the ADC is used in a television receiver, a threshold backoff level of 1.6 dB may be used. This will produce an accurate result with reasonable convergence speed. Accordingly, using formula (2), where the saturation point of the ADC is 2048 mV, a threshold amplitude value of 1704 mV can be used to achieve a threshold backoff level of 1.6 dB. In this example, the threshold counter value may be set so that the AGC target average amplitude will be decreased when 0.02% of the samples exceed the threshold amplitude value.

In some cases, the comparison circuit 304, the counter circuit 306, and/or the target control circuit 308 may be implemented digitally. In these cases the comparison circuit 304, the counter circuit 306, and/or the target control circuit 308 may be implemented using one or more digital signal processing (DSP) units, one or more application-specific integrated circuits (ASIC), any other suitable digital technology, or any combination thereof.

In some cases, instead of using a single threshold amplitude value throughout, the AGC loop 300 may be configured to use a first low threshold amplitude value to achieve quick convergence, and then after a predetermined period of time, switch to a second higher threshold amplitude value to achieve a more accurate AGC target average amplitude. The predetermined period of time in which the first low threshold amplitude is used is selected to give the target average amplitude time to converge. For example, initially a first low threshold amplitude of 3.0 dB backoff from ADC saturation point and 0.1% threshold counter value may be used, then after the predetermined period of time has elapsed a second low threshold amplitude of 1.6 dB backoff from ADC saturation point and 0.02% threshold counter value may be used.

Figure 4:
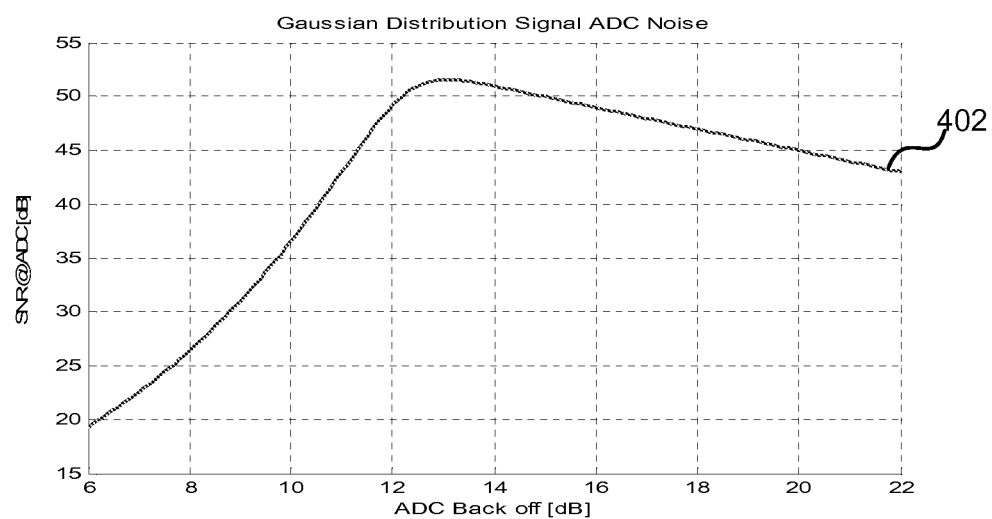
FIG. 4 is graph of the signal to quantization noise ratio of a signal with a Gaussian amplitude distribution with respect to ADC backoff level.

Reference is now made to FIG. 4 which illustrates the ADC quantization noise (represented by the SNR at the output of the ADC) 402 as a function of the ADC backoff level for an input signal with a Guassian amplitude distribution. The ADC backoff level represents the difference between the saturation point and the RMS (root mean square) value of the ADC input signal in dB. The ADC backoff level can be calculated from the saturation point and the RMS of the ADC input signal using equation (4):

$$ADC \text{ backoff } level_{dB} = 20 \log_{10}\left(\frac{\text{saturation point}}{ADC \text{ input signal RMS}}\right) \quad (4)$$

As the ADC backoff level increases the threshold amplitude value and the amplitude of the gain-adjusted signal 110 decrease. It can be seen from FIG. 4 that the SNR drops (i.e. the quantization noise increases) sharply on the left hand side when the ADC backoff level is decreased from 13 dB due to saturation of the ADC; whereas it drops only gradually when the ADC backoff level is increased from 13 dB. Accordingly, ideally the ADC backoff level is selected to be as high as possible without introducing visible degradation due to ADC saturation. In the case shown in FIG. 4, the ideal ADC backoff level is 13 dB.

It is noted that the curve shown in FIG. 4 is specific to an input signal with a Gaussian amplitude distribution and that a signal with another amplitude distribution would produce a different SNR curve.

Figure 5:
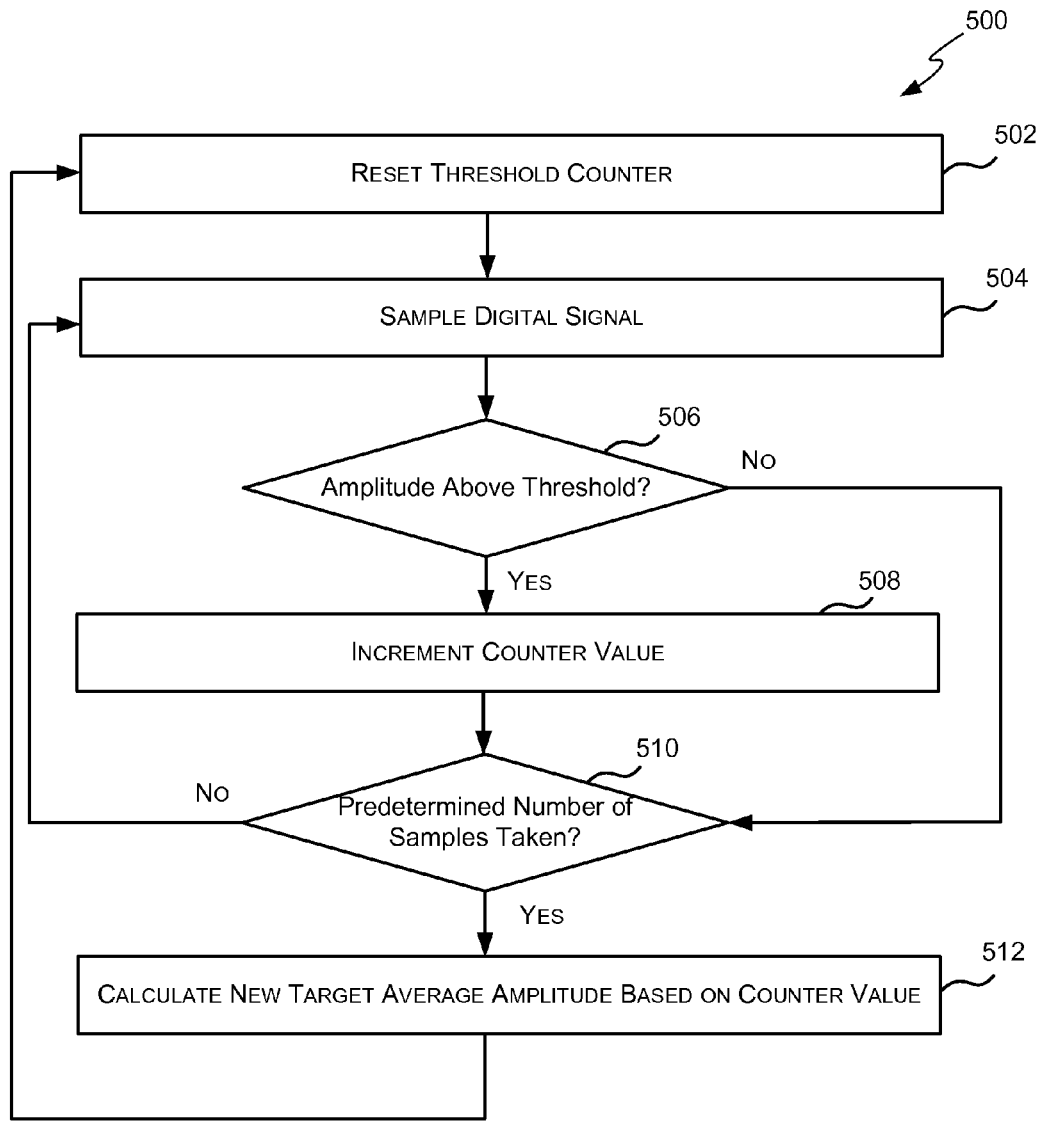
FIG. 5 is a flowchart of a method for dynamically adjusting the automatic gain control target average amplitude.

Reference is now made to FIG. 5 which illustrates a method 500 for dynamically adjusting the AGC target average amplitude. At step 502, the counter value is reset. As described above, the counter value is used to count the number of samples where the amplitude exceeds a threshold amplitude value. Once the counter value has been reset, the method 500 proceeds to step 504.

At step 504, the digital signal 112 output by the ADC 104 is sampled. The digital signal 112 may be sampled by a comparison circuit, such as comparison circuit 304 of FIG. 3. Once, the digital signal 112 has been sampled the method 500 proceeds to step 506.

At step 506, it is determined whether the amplitude of the sample taken in step 504 is greater than a threshold amplitude value. The determination may be performed by a comparison circuit, such as comparison circuit 304 of FIG. 3, which compares the amplitude of the sample to the threshold amplitude value. If the amplitude of the sample is greater than the threshold amplitude value then the method 500 proceeds to step 508. If, however, the amplitude of the sample is not greater than the threshold amplitude value then the method proceeds to step 510.

At step 508, the counter value is incremented. In some cases the counter value may be incremented by a counter circuit, such as counter circuit 306 of FIG. 3, when it receives an indication from a comparison circuit, such as comparison circuit 304 of FIG. 3, that the sample exceeds the threshold amplitude value. Once, the counter value has been incremented, the method proceeds to step 510.

At step 510, it is determined whether a predetermined number of samples have been taken. In some cases a counter circuit, such as counter circuit 306, may be configured determine when the predetermined number of samples have been taken. In other cases, a target control circuit, such as target control circuit 308, may be configured to determine when the predetermined number of samples have been taken. If the predetermined number of samples have not been taken then the method proceeds back to step 504. If, however, the predetermined number of samples have been taken then the method 500 proceeds to step 512.

At step 512, a new AGC target average amplitude is calculated based on the counter value. In some cases, a target control circuit, such as target control circuit 308 of FIG. 3, calculates the new AGC target average amplitude upon receiving the counter value from a counter circuit, such as counter circuit 306 of FIG. 3.

In some cases, if the counter value is greater than a threshold counter value then the AGC target average amplitude is decreased. Conversely, if the counter value is less than the threshold counter value then the AGC target average amplitude is increased. If the counter value is equal to the threshold counter value then the AGC target average amplitude is not changed.

In some cases, calculating the new AGC target value comprises first calculating an error value that represents the difference between the threshold counter value and the counter value.

For example, the error value may be calculated according to formula (5) shown below:

$$\text{error} = \text{threshold counter value} - \text{counter value} \quad (5)$$

Once the error value has been calculated the new AGC target average amplitude may be calculated according to formula (6) shown below:

$$\text{new AGC target} = \text{current AGC target} + k * \text{error} \quad (6)$$

where error is the error value calculated from equation (5) and k is the loop gain (e.g. k=1/64). As is known to those of skill in the art, the loop gain is a measure of the gain of a system controlled by a feedback loop. In amplifiers with feedback, the loop gain is the product of the gain of the feedback loop and the feedback factor in that loop. The loop gain controls how much change is implemented by the control value (the AGC target average amplitude). It also controls the trade-off in the feedback loop between the residual noise level and tracking (and convergence) speed of the loop. Bigger loop gains give faster tracking (convergence) speed, but produce noisier results. Conversely, smaller loop gains give slower tracking (convergence), but produce more accurate results. Once the new AGC target average amplitude has been calculated it is provided to the AGC circuit 106 and the method 500 proceeds back to step 502.

The term 'processor' and 'computer' are used herein to refer to any device, or portion thereof, with processing capability such that it can execute instructions. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of controlling an automatic gain control circuit used to adjust gain of a signal input to an analog to digital converter, the method comprising:
   (a) sampling an output of the analog to digital converter to obtain a sample;

(b) determining whether an amplitude of the sample is greater than a threshold amplitude value, the threshold amplitude value being less than a saturation point of the analog to digital converter;

(c) in response to determining that the amplitude of the sample is greater than the threshold amplitude value, incrementing a counter value;

(d) repeating steps (a) to (c); and (e) periodically adjusting a target average amplitude of the automatic gain control circuit based on the counter value, the automatic gain control circuit being configured to adjust the gain of the signal input to the analog to digital converter to make an average amplitude of the output of the analog to digital converter equal to the target average amplitude, wherein adjusting the target average amplitude comprises comparing the counter value to a first threshold counter value and decreasing the target average amplitude in response to determining the counter value is greater than the first threshold counter value.

2. The method according to claim 1, further comprising resetting the counter value after a predetermined number of samples have been obtained.

3. The method according to claim 1, further comprising resetting the counter value after a predetermined time has elapsed.

4. The method according to claim 1, wherein adjusting the target average amplitude based on the counter value further comprises increasing the target average amplitude in response to determining the counter value is less than a second threshold counter value.

5. The method according to claim 4, wherein the first and second threshold counter values are the same.

6. The method according to claim 5 wherein the target average amplitude is adjusted according to the following formula:

new AGC target=current AGC target+$k$*error wherein k is the loop gain and error is the difference between the first threshold counter value and the counter value.

7. The method according to claim 1, wherein steps (a) to (e) are executed using a first threshold amplitude value and steps (a) to (e) are repeated using a second threshold amplitude value, wherein the second threshold amplitude value is higher than the first threshold amplitude value.

8. A circuit to dynamically control an automatic gain control circuit used to adjust a gain of a signal input to an analog to digital converter, the circuit comprising:

a comparator circuit configured to:

obtain a plurality of samples of an output of the analog to digital converter; and determine, for each sample, whether an amplitude of the sample is greater than a threshold amplitude value, the threshold amplitude value being less than a saturation point of the analog to digital converter; and in response to determining that the amplitude of a sample is greater than the threshold amplitude value, output an indication that the sample amplitude is greater that the threshold amplitude value;

a counter circuit coupled to the comparator circuit, the counter circuit configured to receive indications from the comparator circuit and increment a counter value for each indication received; and a target control circuit coupled to the counter circuit, the target control circuit configured to periodically receive the counter value from the counter circuit and adjust a target average amplitude of the automatic gain control circuit based on the counter value, the automatic gain control circuit being configured to adjust the gain of the signal input to the analog to digital converter to make an average amplitude of the output of the analog to digital converter equal to the target average amplitude, wherein adjusting the target average amplitude comprises comparing the counter value to a first threshold counter value and decreasing the target average amplitude in response to determining the counter value is greater than the first threshold counter value.

9. The circuit according to claim 8, wherein the comparator circuit is configured to obtain a predetermined number of samples.

10. The circuit according to claim 9, wherein at least one of the counter circuit and the target control circuit is further configured to reset the counter value after the predetermined number of samples has been obtained.

11. The circuit according to claim 8, wherein adjusting the target average amplitude based on the counter value further comprises increasing the target average amplitude in response to determining the counter value is less than a second threshold counter value.

12. The circuit according to claim 11, wherein the first and second threshold counter values are the same.

13. The circuit according to claim 12, wherein the target average amplitude is adjusted according to the following formula:

new AGC target=current AGC target+$k$*error, wherein k is the loop gain and error is the difference between the first threshold counter value and the counter value.

14. The circuit according to claim 8, wherein the threshold amplitude value is a first threshold amplitude value and the comparator circuit is further configured to:

obtain a second plurality of samples of the output of the analog to digital converter; and determine, for each sample of the second plurality of samples, whether the amplitude of the sample exceeds a second threshold amplitude value, the second threshold amplitude value being less than the saturation point of the analog to digital converter and greater than the first threshold amplitude value; and in response to determining that a sample is greater than the second threshold amplitude value, output an indication that the sample is greater than the second threshold amplitude value.

* * * * *